United States Patent [19]
Cohn et al.

[11] Patent Number: 6,142,358
[45] Date of Patent: Nov. 7, 2000

[54] WAFER-TO-WAFER TRANSFER OF MICROSTRUCTURES USING BREAK-AWAY TETHERS

[75] Inventors: Michael B. Cohn; Roger T. Howe, both of Berkeley, Calif.

[73] Assignee: The Regents of the University of California, Oakland, Calif.

[21] Appl. No.: 08/866,954

[22] Filed: May 31, 1997

[51] Int. Cl.[7] .......................... B23K 31/02; B23K 1/018; H01L 23/52; B65G 49/07
[52] U.S. Cl. .................... 228/44.7; 228/120; 228/138; 228/177; 228/191; 414/935; 414/936; 257/737
[58] Field of Search ............... 228/177, 110.1, 228/120, 138, 135, 191, 180.21, 44.7; 414/935, 936, 937, 938, 939, 940, 941; 257/737, 738; 438/613

[56] References Cited

U.S. PATENT DOCUMENTS

| | | | |
|---|---|---|---|
| 4,077,694 | 3/1978 | Cobaugh et al. | 339/176 MP |
| 4,194,800 | 3/1980 | Chow | 339/17 CF |
| 4,401,352 | 8/1983 | Heisey | 339/17 CF |
| 4,402,131 | 9/1983 | Roberts | 29/622 |
| 4,759,491 | 7/1988 | Fisher | 228/180.2 |
| 4,878,846 | 11/1989 | Schroeber | 439/65 |
| 5,319,237 | 6/1994 | Legros | 257/522 |
| 5,499,754 | 3/1996 | Bobbio et al. | 228/42 |
| 5,525,545 | 6/1996 | Grube et al. | 437/209 |
| 5,539,550 | 7/1996 | Spitzer | 359/59 |
| 5,821,627 | 10/1998 | Mori et al. | 257/780 |
| 5,882,532 | 3/1999 | Field et al. | 216/2 |
| 5,903,059 | 5/1999 | Bertin et al. | 257/785 |
| 5,938,454 | 8/1999 | Brodsky et al. | 439/71 |

OTHER PUBLICATIONS

Yablonovitvh, APL 56:24, p. 2419, 1990.
Fedder, SSAW p. 63, 1992.
Licari Multichip Module, 1995.

*Primary Examiner*—Patrick Ryan
*Assistant Examiner*—Kiley Stoner
*Attorney, Agent, or Firm*—Pennie & Edmonds LLP

[57] ABSTRACT

Break-away tethers to secure electronic, mechanical, optical, or other microstructures, during release from one substrate and transfer to another. Microstructures are fabricated with integrated tethers attaching them to a first substrate. The structures are undercut by etching and contacted and bonded to a second substrate. First and second substrates are separated, breaking the tethers.

5 Claims, 7 Drawing Sheets

WAFER-TO-WAFER TRANSFER OF MICROSTRUCTURES USING BREAK-AWAY TETHERS

BACKGROUND

1. Field of Invention

This invention relates to microfabricated structures, specifically to an improved fabrication technique which relies on wafer-to-wafer transfer of microstructures rather than monolithic integration.

2. Description of Prior Art

Monolithic integration is an attractive approach to fabricating accelerometers, displays, and other microsystems. Such microsystems are fabricated by a planar lithographic process on a single substrate, enabling high-volume, low-cost production. Unfortunately, several problems attend the design of integrated systems. Materials may interact during fabrication, particularly during high-temperature steps. Also, due to their complexity, fabrication of these systems may require many steps, decreasing yield and increasing development costs.

Several researchers have proposed techniques to achieve the economic and performance benefits of monolithic integration without the restriction of using a single substrate.

NOMENCLATURE

Handle substrate will be used to indicate a macroscopic piece of material on or in which microstructures are fabricated.

Target substrate will denote a macroscopic piece of material to which microstructures may be transferred.

Since some microfabrication processes use layered substrates or thin, membrane-like substrates, the term support will encompass conventional substrates, as well as other pieces of material on or in which a microstructure is mechanically fixed, either permanently or temporarily.

The term chiplet denotes a microfabricated, planar support carrying one or more microfabricated devices. A chiplet will be taken as a representative example of a microstructure which may be transferred using the present invention. In practice, however, the invention may used to transfer isolated microstructures without such supports.

Yablonovitch: Epitaxial Lift-Off

One approach is to fabricate microstructures on one substrate and transfer them to another. Yablonovitch et al. ("Van der Waals bonding of GaAs Epitaxial Liftoff Films Onto Arbitrary Substrates," *Applied Physics Letters, Jun.* 11, 1990, Vol. 56, No. 24: 2419–21) propose epitaxial lift-off, in which a substrate with an etchable sacrificial layer supports a thin surface layer. Devices such as semiconductor lasers or transistors are formed in the surface layer. The sacrificial layer is removed with a highly selective etchant, freeing the surface layer. The surface layer may then be affixed to a new substrate, such as a glass plate. Van der Waals forces or an adhesive may be used for attachment.

One problem with this technique is that devices are released as a continuous film, which is difficult to divide or distribute over one or more target substrates. The released film is also fragile, making it difficult to manipulate and align. Bubbling from the release etch can damage the film. If the film is first bonded to the target substrate, then released, the release etch may attack the target structures. Also, in this case, the release etch must penetrate laterally from the edge of the bonded sandwich, which typically requires several hours. Typical release etchants (hydrofluoric acid) readily attack metals, as well as native oxides that occur at most material interfaces. This places severe constraints on the released structures. In addition, van der Waals bonding requires extremely smooth, parallel surfaces; typically, it will not be effective unless the samples have been planarized and polished. If a high-quality bond is successfully formed, however, thermal expansion mismatch between film and substrate may cause high stresses due to the extremely thin transition layer. Glues or other adhesive mechanisms will generally create viscous and capillary forces which would damage the transferred film.

Spitzer: Tiles and Bulk-Micromachined Bridges

Figure 7:
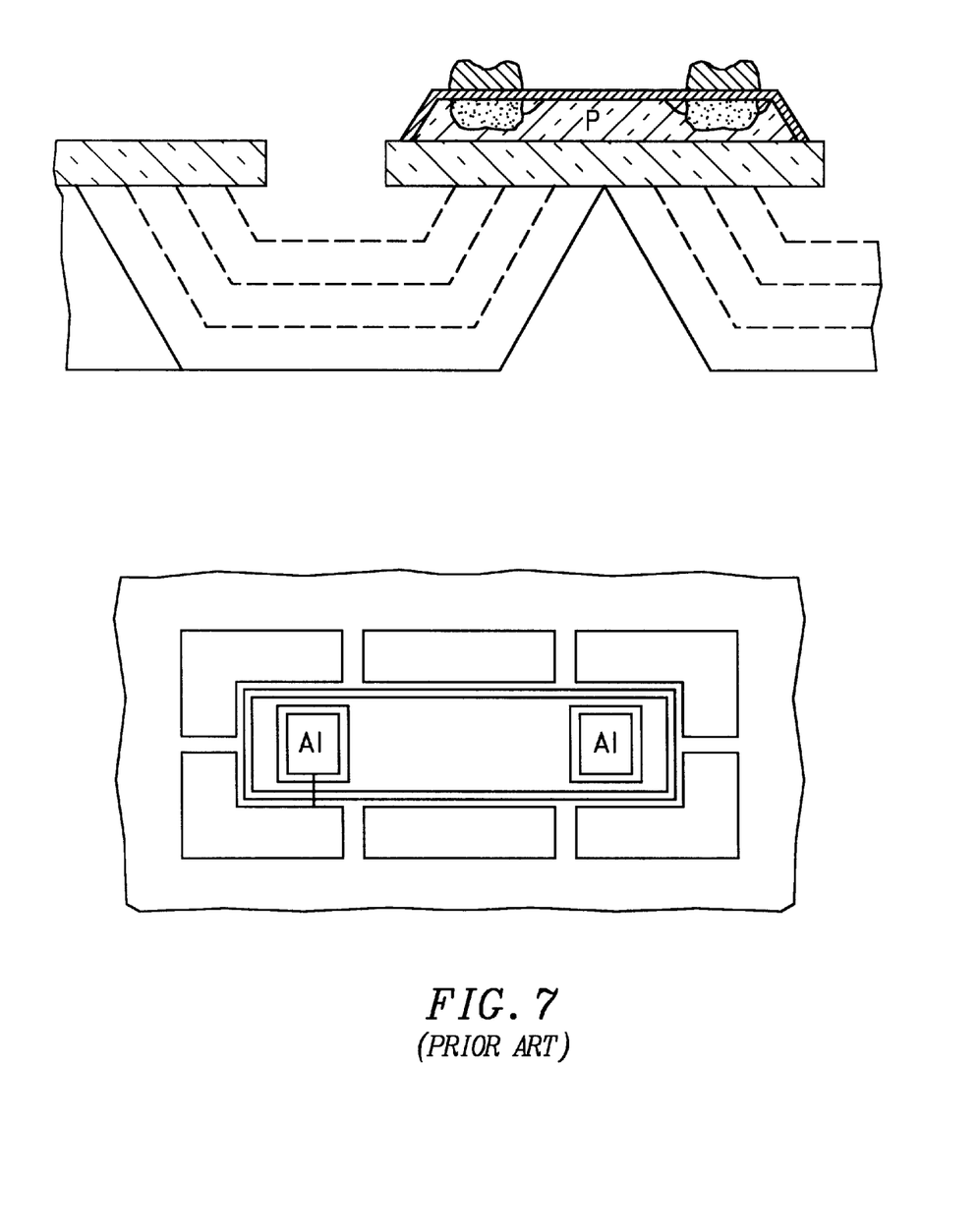

Spitzer et al. (Kopin Corp., U.S. Pat. No. 5,539,550, 1993) describe several techniques in which the handle substrates may be diced into tiles or chips prior to the release step. Both mechanical sawing and chemical etching are proposed. In the latter case, the chip may remain temporarily suspended within the handle substrate by a series of bridges (see FIG. 7). The chip may then be removed with a vacuum wand, breaking the bridges.

Removing chips with a vacuum wand constitutes an extra step compared to direct wafer-to-wafer transfer. Moreover, this operation, basically a serial assembly process, does not preserve the economies of wafer-scale lithographic fabrication. At the same time, the technique is constrained to use with whole chips, rather than individual microstructures, due to the inherently coarse resolution of bulk etching. Thus, it does not address the problem of creating dense, heterogeneous assemblies of microstructures.

Fedder:Fusible Supports

Fedder (Fedder, G. K.; Chang, J. C.; Howe, R. T. "Thermal Assembly of Polysilicon Microactuators with Narrow-Gap Electrostatic Comb Drive." *Technical Digest, IEEE Solid-State Sensor and Actuator Workshop*, Hilton Head Island, S.C., USA, Jun. 22–25, 1992. New York, N.Y., USA: IEEE, pp. 63–8.) describes the use of fusible supports (Tethers) for supporting fragile micromechanical structures during sacrificial-layer etching and drying. These supports prevent suspended structures such as microbridges from adhering to the substrate due to capillary forces. The supports are vaporized at the end of the process by a high-power current pulse.

These structures are not proposed for the transfer of microstructures, and would present several problems in such an application. Experimentally, no more than four such structures could be electrically operated in parallel or series. Thus, large numbers of electrical contacts would be necessary. Electrical access to the front of the substrate would be needed during transfer, and batch transfer would be impractical.

MCNC Corp.: Flip-Chip MEMS

An alternative to these micromachining approaches is flip-chip bonding, in which complete IC dice are mounted face-down on a substrate, typically using small bumps of solder. MCNC Corp. developed a fluxless solder technique suitable for use with micromechanical structures. This technique, Plasma-Activated Dry Soldering (PADS) is described in U.S. Pat. No. 5,499,754 to Bobbi D et al.

This approach has several limitations. Solder bumps have dimension on order of 100 µm, and thus contribute significant parasitic capacitance and inductance. Electrically, such systems are thus not equivalent to true monolithic designs. Die sizes below 1 mm are impractical, and there is no mechanism for batch or wafer-scale transfer. Finally, the front of the die is inaccessible, and the die shape is constrained to be rectangular. Thus, stacking and interleaving of devices are not practical.

Licari:Tape-Automated Bonding (TAB)

Licari (*Multichip Module Design, Fabrication, and Testing,* McGraw-Hill, Inc. 1995) reviews the well-known TAB process in which dice are flip-chip mounted onto a flexible tape with conductive traces. The tape then serves as a carrier by which the dice may be mounted to a printed circuit or other substrate. Again, however, this is a serial rather than a batch process. Also, the scale (chips ~1–20 mm in linear dimension) is not commensurate with microstructures (500 $\mu$m or less).

OBJECTS AND ADVANTAGES

Accordingly, several objects and advantages of the present invention are:

(a) to enable batch transfer of microstructures from one substrate to another;

(b) to provide a process throughput and feature density comparable to microlithographic patterning processes;

(c) to enable transfer of standard, existing types of microstructures (integrated circuit transistors, LEDs, etc.) with minimal modification.

(d) to place various types of microstructures on a single substrate while maintaining electronic and other characteristics of a monolithic integrated system.

In some applications, such as rework, or formation of large, sparse arrays of microstructures (as in flat-panel displays), the present invention will allow:

(e) selective transfer of a small number of structures to specific sites on a substrate;

(f) re-distribution of microstructures from a small substrate to a larger substrate, using a rapid step-and-repeat process;

(g) continued use of obsolescent foundries for production of such distributable microstructures on small handle substrates.

By enabling transfer of individual microstructures (rather than chips or continuous films), the present invention (h) enables dense stacked or side-by-side arrangements via sequential transfer steps.

Many advantages stem from the potential to fabricate components independently and combine them at the end of the process sequence:

(i) processing may be independently optimized for each component, for example, by performing a long, high-temperature anneal to remove stress from micromechanical structures, without causing dopant diffusion in electronic devices;

(j) delivery times may be shortened by performing several process steps in parallel.

The use of compliant tethers in the present invention has demonstrated:

(k) local fine-alignment of microstructures to a target substrate in a batch transfer process;

(l) tolerance of particulates: a single particle will not ruin a whole wafer, as would be the case with Van de Waals bonding.

(m) compensation for surface irregularities (curvature, particulates, topography) in the substrates.

Without additional processing, tethers have been inserted to anchor microstructures to the target substrate, thus:

(n) relieving stresses due to thermal expansion mismatch;

(o) and providing electrical isolation.

This invention is particularly suitable for microelectromechanical systems (MEMS) because of its ability to (p) provide vacuum and hermetic packaging on-chip at low cost.

Several distinguishing features of the invention are:

(p) with a typical microstructure size of 200 $\mu$m, approximately $10^6$ microstructures can be transferred from an 8-inch diameter wafer;

(r) the release etch is performed in advance of the transfer, since the tethers secure the microstructures;

(s) the transfer cycle is thus much shorter than in the prior art;

(t) bulk etching is not needed, thus facilitating miniaturization, reducing consumption of materials, and reducing processing time;

(u) the handle wafer can be re-used;

(v) a thin-film material may be used to affix a transferred microstructure to a target substrate, thus allowing high interconnect density and compatibility with integrated circuits;

(w) various types of microstructures may be assembled on a single substrate without subjecting them to aggressive thermal, chemical, or mechanical treatment.

DESCRIPTION OF FIGURES

1. Wafer-to-wafer transfer of a microstructure using thin-film tethers. Isometric view.
2. Cross-section view of basic transfer process.
3. Close-up of tether, solder bump, and chiplet assembly.
4. Tethered transfer with snaps. Cross-section.
5. Transferred chiplet with deposited thin-film coating. Film furnishes mechanical, electrical interconnections and hermetically encapsulated cavity.
6. Using a deposited thin-film to bond chiplet to target substrate. No solder or mechanical fasteners are required. Substrates are separated to break tethers.
7. Prior art. U.S. Pat. No. 5,539,550 (Kopin Corp.) showing bulk-machined bridges for temporary support of a chemically-diced chip within a semiconductor wafer.

REFERENCE NUMERALS IN DRAWINGS 102. anchor
104. sacrificial layer
106. tether
108. chiplet
110. handle substrate
112. microstructure
114. solder bump (indium)
116. target substrate
404. latch
406. barb
502. deposited film
508. encapsulated cavity
602. standoff

SUMMARY

Break-away tether to secure microstructures during release from one substrate and transfer to another. Structures, such as micromachines sensors, are fabricated with integrated tethers attaching them to a first substrate. The structures are undercut by etching and contacted and bonded to a second substrate. First and second substrates are separated, breaking the tethers.

DESCRIPTION OF THE INVENTION

Figure 3:
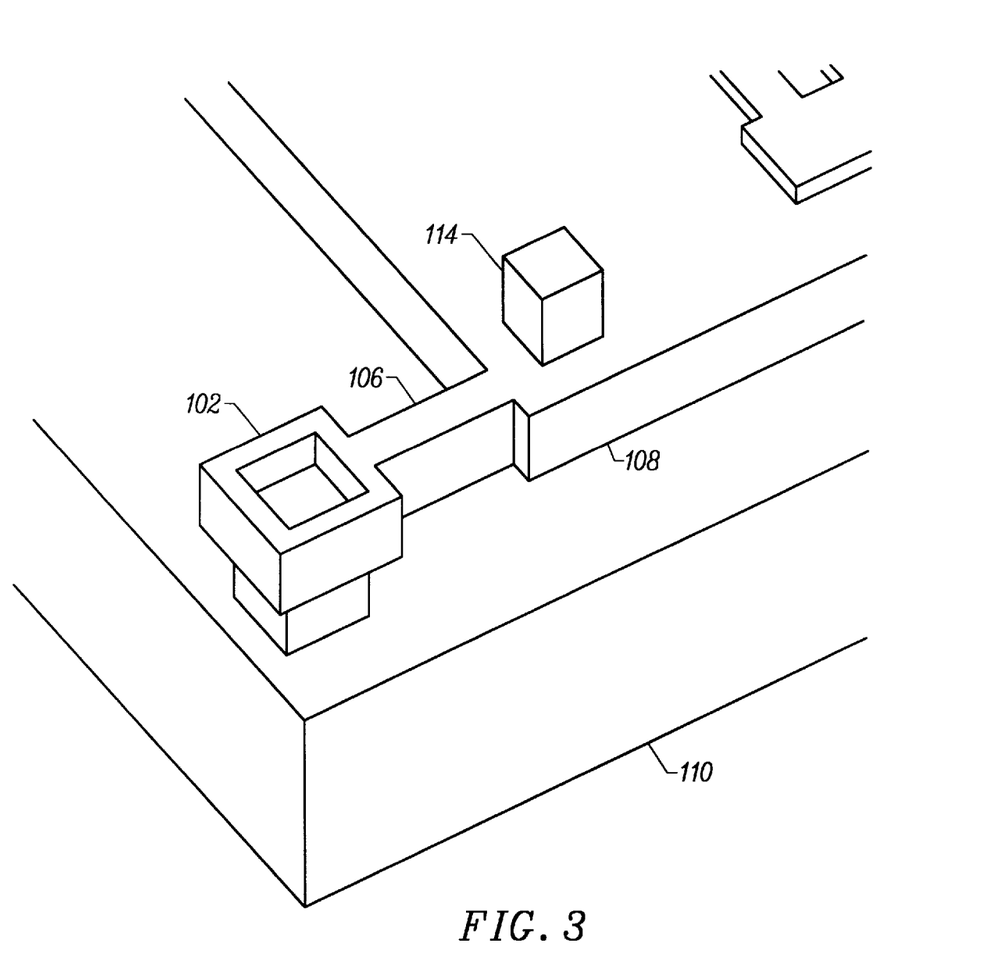

FIGS. 1–3 —Preferred Embodiment

FIG. 1 is an overall perspective view of the tether 106, showing its use with a sample chiplet 108, and the key steps of the transfer process.

Figure 1A:
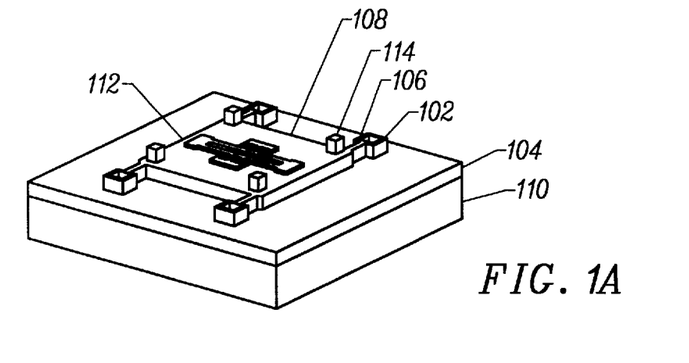

Initially, as shown in FIG. 1a, a handle substrate 110, such as a silicon wafer, is provided. A sacrificial layer 104, such as phosphosilicate glass (PSG) is deposited on the handle substrate. Chemical vapor deposition (CVD) or a similar deposition technique may be employed. The phosphorus doping level is chosen to enable rapid etching in hydrofluoric acid (HF). A thickness of 1 $\mu$m is typical.

Anchors 102 penetrate the sacrificial layer and attach to the handle substrate. A tether 106 is attached to each anchor. The chiplet 108 is connected to the tethers. Typically, the tethers, anchors, and chiplet would be formed simultaneously by depositing a film such as polycrystalline silicon (e.g. by CVD) and then defining the film lithographically.

One or more solder bumps 114 and a microstructure 112 lie on the chiplet. In this case, the microstructure is shown schematically as a micromechanical resonator, though generally any microfabricated structure may be used. The solder bumps are preferably 5–10 $\mu$m thick. The solder bumps are preferably positioned where the tethers join the edge of the chiplet, so as to isolate the MEMS structure from stresses transmitted by the tethers. The solder bumps may be formed in the manner of flip-chip solder bumps, of lean/tin, gold/tin or other suitable solder alloy. Alternately, they may be formed from indium or gold, thus enabling compression bonding at room temperature. The latter approach may be preferred in many cases, since solders may attack thin films by diffusion or alloying in the molten state.

Figure 1B:
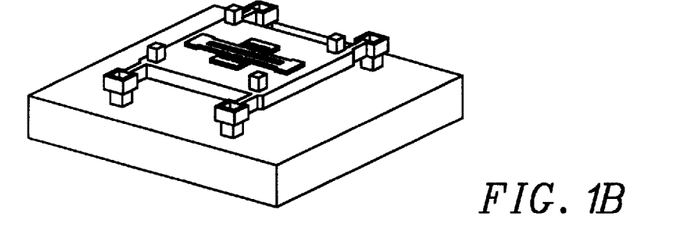

FIG. 1b shows the handle substrate and chiplet assembly with the sacrificial layer removed. This is achieved by etching in HF, as is known in the art of sacrificial-layer surface micromachining. HF is able to laterally undercut polysilicon structures formed on PSG, by virtue of its extreme etch selectivity (in excess of $10^6$), Full-strength, diluted, or buffered HF may be employed as needed.

Large-area released microstructures are typically dried using supercritical $CO_2$ or similar techniques, to prevent capillary forces from damaging them, or clamping them to the substrate. Unexpectedly, this step turns out be unnecessary. Released structures may be dried using an $N_2$ jet. The use of opposed tethers (as in a clamped-clamped beam) seems to prevent damage to the structures. Clamping to the substrate, if it occurs, does not affect the transfer process.

Figure 1C:
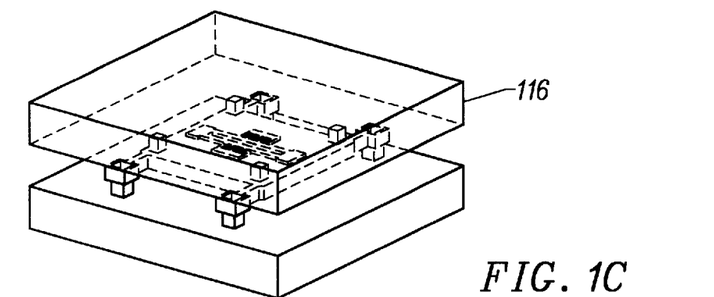

FIG. 1c shows a target substrate 116 aligned and contacted to the handle substrate assembly. The target substrate may carry circuitry or other microstructures, such as alignment marks or structures for packaging the transferred structures. Alignment may be accomplished with readily available equipment such as a wafer bonding aligner (Karl Suss Corp.) or even a contact printing aligner (Quintel Corp.). The target substrate may be a semiconductor wafer, or may be chosen for its optical, chemical, or mechanical properties. Low-cost materials such as plastic may be chosen for display applications. Alternatively, the target substrate may be a structural component in an automobile, the external package of a product, paper currency, or other material. The mechanical flexibility of the tethers is able to compensate for irregularities in the surface of the target substrate.

Figure 1D:
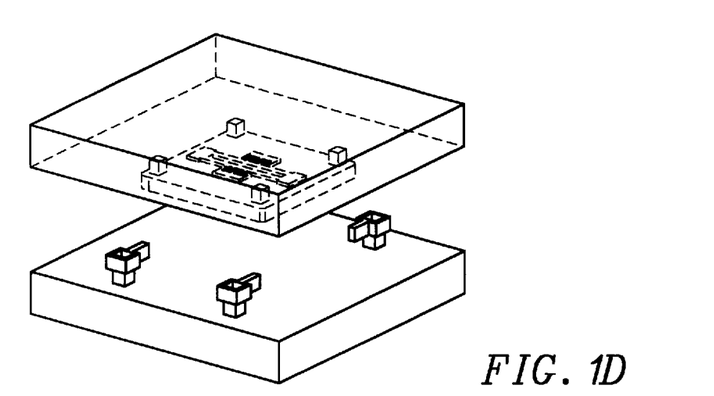
Figure 2A:
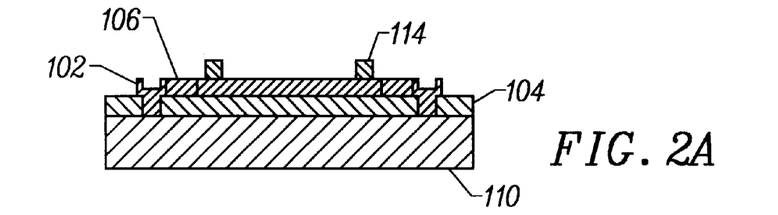
Figure 2B:
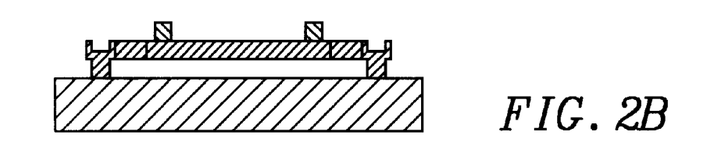
Figure 2C:
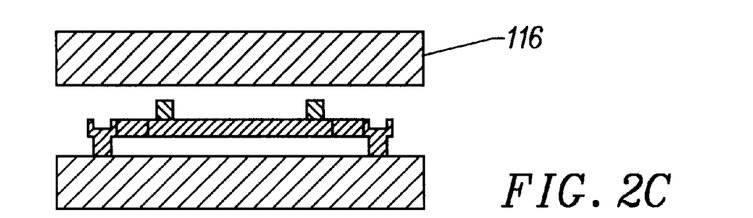
Figure 2D:
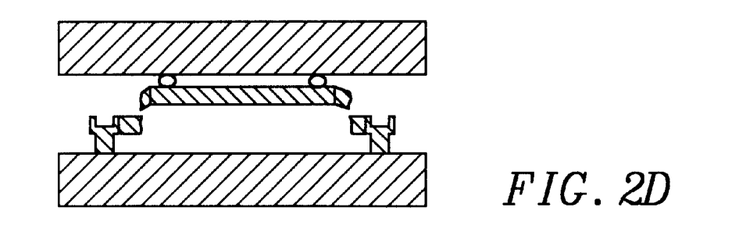

In FIG. 1d, the chiplet has been bonded to the target substrate by reflowing the solder bumps. This step may be performed in the manner of flip-chip bonding: e.g., by conductive, radiative, or vapor condensation heating. The reflow may be performed in air, inert atmosphere, or vacuum. A vacuum-sealed cavity has been demonstrated by patterning solder in a closed ring. A flux may be employed, though a fluxless technique is preferably to maintain cleanliness. Fluxless soldering has been demonstrated using the PADS (Plasma Activated Dry Soldering/MCNC Corp.) technique, as well as a number of gold-based solders.

FIG. 2 is a cross-section view of the structure and process of FIG. 1. FIG. 2c shows the target substrate aligned facing the chiplet assembly. In FIG. 2c', the target substrate has been contacted by the chiplet. Contact pressures in the range from 0–10,000 PSI have been successfully employed when soldering. Typically, the weight of the target substrate resting on the chiplet is sufficient to form a solder bond. In FIG. 2d, the handle substrate and target substrate have been separated, breaking the tethers. The separation step is preferably performed using two vacuum chuck. However, the structures are surprisingly robust to scraping and shearing, so that the substrates may even be pried apart by hand.

FIG. 3 is a detail of the anchor, tether, and chiplet, shown in perspective, before transfer.

Figure 4A:
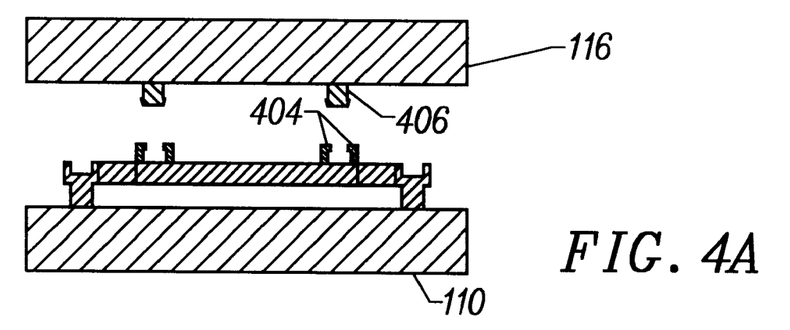
Figure 4B:
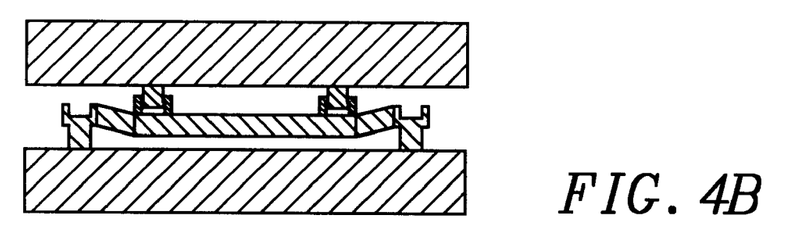
Figure 4C:
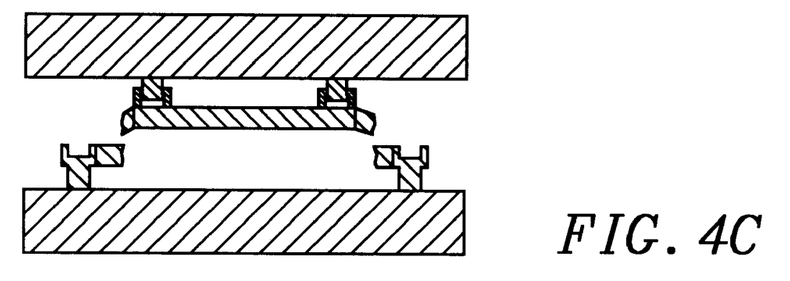

Alternate Embodiment #1:FIG. 4—Mechanical Snap Fasteners

FIG. 4 shows an alternate embodiment of the invention, in which mechanical latch or snap mechanisms are employed in place of solder bumps to accomplish the transfer of the chiplet. Each snap mechanism comprises a barb 406, which engages a pair of latches 404. An advantage of the tether structure becomes evident here: its thickness, composition, and shape may be precisely specified, since it is a thin-film, microlithographically-defined structure. Thus, it may be designed to break at a tension suitable to the mechanical snap mechanism. Such snap mechanisms are typically weaker than soldered connections. Another advantage is that the tether may comply in a spring-like fashion, to allow local self-alignment of individual chiplets during the mechanical latching step.

Figure 5:
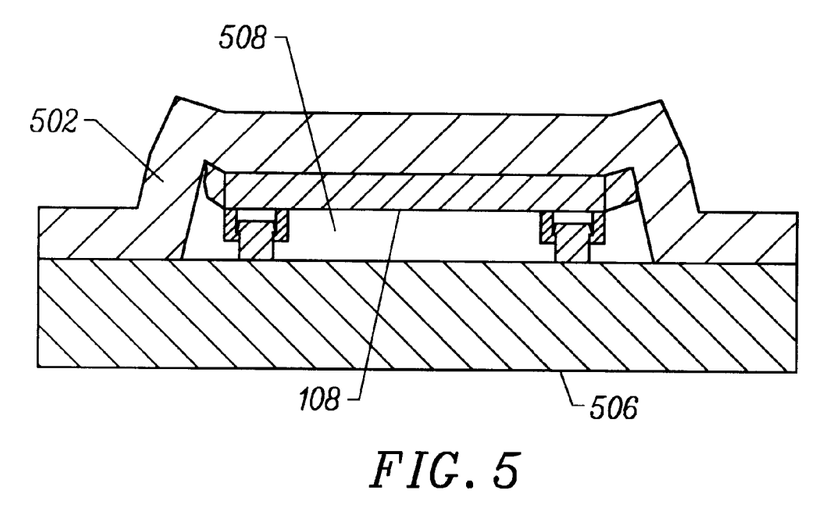

Alternate Embodiment #2:FIG. 5—Film Deposition After Transfer

FIG. 5 shows the chiplet/target substrate assembly with the addition of a deposited film 502. The film may be deposited in a directional manner, as by evaporation or sputtering, to create the encapsulated cavity 508 underneath the chiplet. Note that the assembly has been inverted with respect to FIG. 4. The deposited film covers and overhangs the chiplet 108 in the manner of snow overhanging a roof. The encapsulated cavity retains the ambient conditions of the film deposition, typically high vacuum or inert gas.

Hermetic and vacuum-sealed structures are needed for the packaging of microfabricated resonators. Resonators with high quality factor require a vacuum ambient, but previous approaches, based on discrete packages, have been uneconomical.

Alternate Embodiment #3:FIG. 5—Film Deposition Before Transfer

Figure 6A:
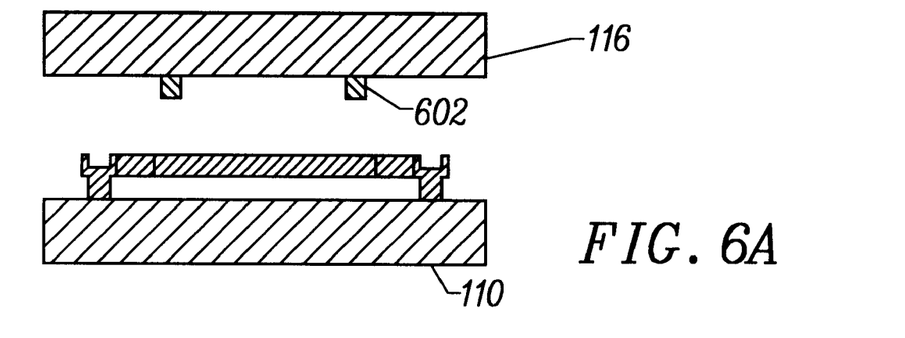
Figure 6B:
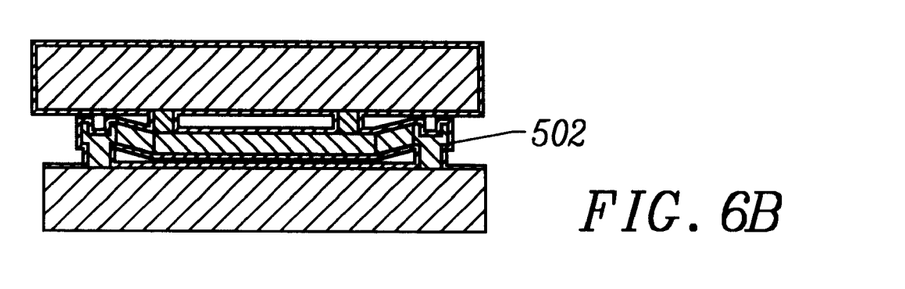
Figure 6C:
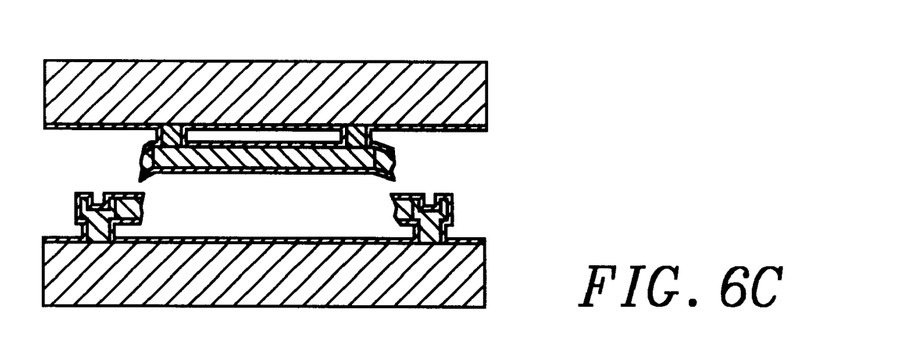

FIG. 6 depicts an alternate embodiment of the invention, in which the deposited film 502 is deposited before transfer, after the chiplet has been brought into contact with the target substrate. This serves to bond the chiplet to the target substrate, without the need for solder bumps or latching mechanisms. However, standoffs 602 may be employed to prevent contact between the target substrate and the microstructure itself.

Since the deposited film secures the chiplet to the target substrate, the design may be extremely simple. Also, the possibility of reflow and cross-contamination between materials is minimized. Feature sizes may also be reduced, since thin-film structures are generally smaller than solder bumps. If desired, the film may be reflowed or alloyed after deposition for increased strength.

The film may also be partially removed by directional etching (plasma etching, ion milling). This would allow access to underlying structures on the target substrate (e.g. contact pads) but would preserve the portions overhung by the chiplet, which may maintain the mechanical bond.

CONCLUSION, RAMIFICATIONS, AND SCOPE OF INVENTION

Thus, the reader will see that the microfabricated tether of the invention provides a means of transferring microstructures from one substrate to another. Since the tether may be designed to break under relatively low tension, a variety of methods may be employed to bond the microstructures to the target substrate. In typical fabrication processes, tethers may be formed simultaneously with other structures, so that no additional processing is needed. The combination of the tether with solder bumps or similar fastening mechanisms is synergistic, since it enables batch processing of transferred microstructures.

While the above description contains many specificities, these should not be construed as limitations on the scope of the invention, but rather as an exemplification of one preferred embodiment thereof. Many other variations are possible.

For example, the solder bumps 114 may be placed directly on the tethers 106 to furnish a compliant linkage between the chiplet and target substrate following transfer. This would allow strain relief or thermal isolation.

Additionally, the target substrate 116 may have one or more apertures in it, to allow direct deposition of material for bonding, or for access using mechanical manipulators to select and transfer specific chiplets. Such apertures may also furnish access by laser for bonding or releasing of specific chiplets.

A laser of appropriate wavelength (e.g. infrared) may also be projected through the substrate material without need for an aperture, achieving the same effects.

The tethers 106 may be fabricated from a spin-on material such as photoresist or polyimide. Such materials may be subsequently plasma- or heat-treated to confer resistance to etchants such as HF.

The chiplet 108 may be formed using the HexSil process (Keller, C. G., Howe, R. T., "Nickel-Filled HexSil Thermally Actuated Tweezers," $8^{th}$ *International Conference on Solid-State Sensors and Actuators and Eurosensors IX, Digest of Technical Papers,* Stockholm, Sweden, June 25–29, 1995, pp. 376–9, vol. 2.) to furnish a three-dimensional structure. Such structures may be sealed to the target substrate to provide packaging or fluid flow channels.

Regions of the handle substrate may be very thin (thinned Si wafers are available from Virginia Semiconductor Corp. and others). In this way, the sacrificial layer and sacrificial etch step may be eliminated and the tethers may be etched from the substrate material.

The handle substrate may be thinned (i.e. using a timed etch in potassium hydroxide solution) after other processing is complete. In this way, the tether transfer process may be applied with existing fabrication processes and equipment.

The handle substrate may be a silicon-on-insulator (SOI) wafer. The insulator material (typically silicon dioxide) may be used as an etch-stop to thin the wafer from the back side, or as a release layer.

Accordingly, the scope of the invention should be determined not by the embodiments illustrated, but by the appended claims and their legal equivalents.

What is claimed is:

1. An apparatus for transferring a microfabricated structure, comprising:

a handle substrate;

a set of anchors positioned on said handle substrate;

a platform supporting a microfabricated structure;

a set of tethers connected between said set of anchors and said platform, said set of tethers assuming a load bearing state to support said platform in the absence of a transfer load, said set of tethers assuming a detached tether state from said anchors in the presence of said transfer load; and a transition mechanism attached to said platform, said transition mechanism adapted to engage a target structure in the presence of said transfer load, which causes said detached tether state, resulting in said transition mechanism and said platform being attached to said target structure.

2. The apparatus of claim 1 wherein said transition mechanism is a solder bump.

3. The apparatus of claim 1 wherein said transition mechanism is a mechanical fastener.

4. The apparatus of claim 1 wherein said transition mechanism is a deposited film.

5. The apparatus of claim 1 wherein said deposited film is selected from the group comprising a chemical vapor deposition film, a sputtered film, an evaporated film, and a spin-coated film.

* * * * *